(12) United States Patent
Lee et al.

(10) Patent No.: US 10,734,461 B2
(45) Date of Patent: Aug. 4, 2020

(54) THIN FILM TRANSISTOR ARRAY PANEL AND ORGANIC LIGHT EMITTING DIODE DISPLAY INCLUDING THE SAME

(71) Applicant: SAMSUNG DISPLAY CO., LTD., Yongin-Si, Gyeonggi-Do (KR)

(72) Inventors: Dong Hee Lee, Hwaseong-si (KR); Hyun Ju Kang, Yongin-si (KR); Sang Won Shin, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/250,642

(22) Filed: Jan. 17, 2019

(65) Prior Publication Data

US 2019/0157367 A1     May 23, 2019

Related U.S. Application Data

(63) Continuation of application No. 15/237,866, filed on Aug. 16, 2016, now Pat. No. 10,192,944.

(30) Foreign Application Priority Data

Dec. 2, 2015  (KR) .................. 10-2015-0170781

(51) Int. Cl.
*H01L 27/32*     (2006.01)
*H01L 29/423*    (2006.01)
(Continued)

(52) U.S. Cl.
CPC ........ *H01L 27/3262* (2013.01); *H01L 27/124* (2013.01); *H01L 27/1225* (2013.01);
(Continued)

(58) Field of Classification Search
CPC ............. H01L 27/3262; H01L 27/1225; H01L 27/124; H01L 27/1255; H01L 27/1288;
(Continued)

(56) References Cited

U.S. PATENT DOCUMENTS

2008/0303020 A1* 12/2008 Shin ................. H01L 29/66742
257/43
2011/0084272 A1    4/2011 Miyanaga et al.
(Continued)

FOREIGN PATENT DOCUMENTS

KR    1020100059586    6/2010
KR    1020120084760    7/2012
(Continued)

*Primary Examiner* — Peter Bradford
(74) *Attorney, Agent, or Firm* — F. Chau & Associates, LLC

(57) ABSTRACT

An exemplary embodiment of the present invention provides a thin film transistor array panel and an organic light emitting diode display including the same including a substrate, a semiconductor disposed on the substrate, a first gate insulation layer disposed on the semiconductor, and a first diffusion barrier layer disposed on the first gate insulation layer. A second diffusion barrier layer is disposed on a lateral surface of the first diffusion barrier layer. A first gate electrode is disposed on the first diffusion barrier layer. A source electrode and a drain electrode are connected to the semiconductor. The first diffusion barrier layer comprises a metal, and the second diffusion barrier layer comprises a metal oxide including the metal.

20 Claims, 17 Drawing Sheets

(51) Int. Cl.
*H01L 27/12* (2006.01)
*H01L 29/49* (2006.01)
*H01L 29/786* (2006.01)
*H01L 29/51* (2006.01)

(52) U.S. Cl.
CPC .... *H01L 27/1255* (2013.01); *H01L 29/42384* (2013.01); *H01L 29/4908* (2013.01); *H01L 29/7869* (2013.01); *H01L 29/78645* (2013.01); *H01L 27/1288* (2013.01); *H01L 29/518* (2013.01); *H01L 29/78606* (2013.01); *H01L 29/78618* (2013.01); *H01L 29/78696* (2013.01); *H01L 2227/323* (2013.01)

(58) Field of Classification Search
CPC ............... H01L 29/4908; H01L 29/518; H01L 29/78606; H01L 29/78618; H01L 29/78645; H01L 29/7869; H01L 29/78696; H01L 2227/323
See application file for complete search history.

(56) References Cited

U.S. PATENT DOCUMENTS

| | | | |
|---|---|---|---|
| 2013/0320317 A1* | 12/2013 | Lee | H01L 29/78606 257/40 |
| 2014/0048800 A1* | 2/2014 | You | H01L 29/7869 257/43 |
| 2014/0124781 A1* | 5/2014 | Terai | H01L 29/12 257/43 |
| 2017/0162840 A1 | 6/2017 | Lee et al. | |

FOREIGN PATENT DOCUMENTS

| | | |
|---|---|---|
| KR | 1020130129674 | 11/2013 |
| KR | 101479917 | 12/2014 |
| KR | 1020130094161 | 8/2018 |

\* cited by examiner

THIN FILM TRANSISTOR ARRAY PANEL AND ORGANIC LIGHT EMITTING DIODE DISPLAY INCLUDING THE SAME

CROSS-REFERENCE TO RELATED APPLICATION

This application is a continuation of U.S. application Ser. No. 15/237,866, filed on Aug. 16, 2016, which claims priority under 35 U.S.C. § 119 to Korean Patent Application No. 10-2015-0170781 filed in the Korean Intellectual Property Office on Dec. 2, 2015, the disclosure of which are incorporated by reference herein in their entirety.

1. TECHNICAL FIELD

Exemplary embodiments of the present invention relate to a thin film transistor array panel, and more particularly to an organic light emitting diode display including the same.

2. DISCUSSION OF RELATED ART

An organic light emitting diode display may include two electrodes and an organic emission layer disposed between the two electrodes. Electrons injected from one electrode and holes injected from the other electrode may combine to form excitons in the organic emission layer. When the excitons are changed from an excited state to a ground state, energy is released, thereby emitting light.

An organic light emitting diode display may include a plurality of pixels each of which may include an organic light emitting diode that is a self-emissive element. A plurality of transistors and at least one capacitor may be formed in each of the pixels to drive the organic light emitting diode. The transistors may include a switching transistor and a driving transistor.

The transistors may be top-gate type transistors in which a gate electrode is disposed on a semiconductor. The semiconductor may include an oxide semiconductor material, and the gate electrode may include a relatively low resistance metal such as copper.

SUMMARY

Exemplary embodiments of the present invention may provide a thin film transistor array panel and an organic light emitting diode display including the same.

An exemplary embodiment of the present invention provides a thin film transistor array panel including a substrate, a semiconductor disposed on the substrate, a first gate insulation layer disposed on the semiconductor, and a first diffusion barrier layer disposed on the first gate insulation layer. A second diffusion barrier layer is disposed on a lateral surface of the first diffusion barrier layer. A first gate electrode is disposed on the first diffusion barrier layer. A source electrode and a drain electrode are connected to the semiconductor. The first diffusion barrier layer includes a metal, and the second diffusion barrier layer includes a metal oxide including the metal.

Lateral edges of the first diffusion barrier layer and the first gate electrode may be substantially aligned with each other.

The semiconductor may include an oxide semiconductor material, and the first gate electrode may include copper.

The first diffusion barrier layer may include titanium, and the second diffusion barrier layer may include titanium oxide.

The semiconductor may include a channel region, and a source region and a drain region disposed on opposite sides of the channel region.

The first gate insulation layer, the first diffusion barrier layer, and the first gate electrode may overlap the channel region of the semiconductor. The second diffusion barrier layer may overlap the source region and the drain region of the semiconductor.

The second diffusion barrier layer may contact a lateral surface of the first gate insulation layer. The second diffusion barrier layer may be disposed directly on the source region and the drain region of the semiconductor.

The first gate insulation layer need not overlap the source region and the drain region of the semiconductor.

The second diffusion barrier layer may cover upper surfaces and lateral surfaces of the source region and the drain region of the semiconductor.

The second diffusion barrier layer may be substantially entirely overlapped with the source region and the drain region of the semiconductor.

The first gate insulation layer may be disposed directly on the channel region, the source region, and the drain region of the semiconductor. The second diffusion barrier layer may be disposed directly on the first gate insulation layer.

The second diffusion barrier layer may be substantially entirely overlapped with the source region and the drain region of the semiconductor.

A second gate insulation layer disposed on the first gate electrode, the second diffusion barrier layer, and the semiconductor may further be included. The second gate insulation layer may be disposed directly on the source region and the drain region of the semiconductor.

The second diffusion barrier layer may be partially overlapped with the source region and the drain region of the semiconductor.

An exemplary embodiment of the present invention may provide a thin film transistor array panel that may include a second gate insulation layer disposed on the first gate electrode and the second diffusion barrier layer, a second gate electrode disposed on the second gate insulation layer, and an interlayer insulation layer disposed on the second gate electrode and the second gate insulation layer. The source electrode and the drain electrode may be disposed on the interlayer insulation layer.

The second gate insulation layer may include silicon nitride.

An exemplary embodiment of the present invention provides an organic light emitting diode display including a substrate, a semiconductor disposed on the substrate, a first gate insulation layer disposed on the semiconductor, and a first diffusion barrier layer disposed on the first gate insulation layer. A second diffusion barrier layer is disposed on a lateral surface of the first diffusion barrier layer. A first gate electrode is disposed on the first diffusion barrier layer. A source electrode and a drain electrode are connected to the semiconductor. A first electrode is connected to the drain electrode. An organic emission layer is disposed on the first electrode, and a second electrode is disposed on the organic emission layer. The first diffusion barrier layer includes a metal, and the second diffusion barrier layer includes a metal oxide including the metal.

Lateral edges of the first diffusion barrier layer and the first gate electrode may be substantially aligned with each other.

The semiconductor may include an oxide semiconductor material. The first gate electrode may include copper. The first diffusion barrier layer may include titanium. The second diffusion barrier layer may include titanium oxide.

The semiconductor may include a channel region and a source region and a drain region disposed on opposite sides of the channel region. The first gate insulation layer, the first diffusion barrier layer, and the first gate electrode may overlap the channel region of the semiconductor. The second diffusion barrier layer may overlap the source region and the drain region of the semiconductor.

In the thin film transistor array panel and the organic light emitting diode display including the same according to some exemplary embodiments of the present invention, the edges of the first diffusion barrier layer and the first gate electrode may be substantially aligned with each other by forming the second diffusion barrier layer which contacts the lateral surface of the first diffusion barrier layer. Thus, performance of the thin film transistor may be prevented from deteriorating. The first diffusion barrier layer might not be protruded more than the first gate electrode, and thus a reduction in performance of the thin film transistor according to an exemplary embodiment of the present invention may be reduced or prevented.

BRIEF DESCRIPTION OF THE DRAWINGS

The above and other features of the inventive concept will become more apparent by describing in detail exemplary embodiments thereof, with reference to the accompanying, in which.

DETAILED DESCRIPTION OF THE EMBODIMENTS

Figure 1:
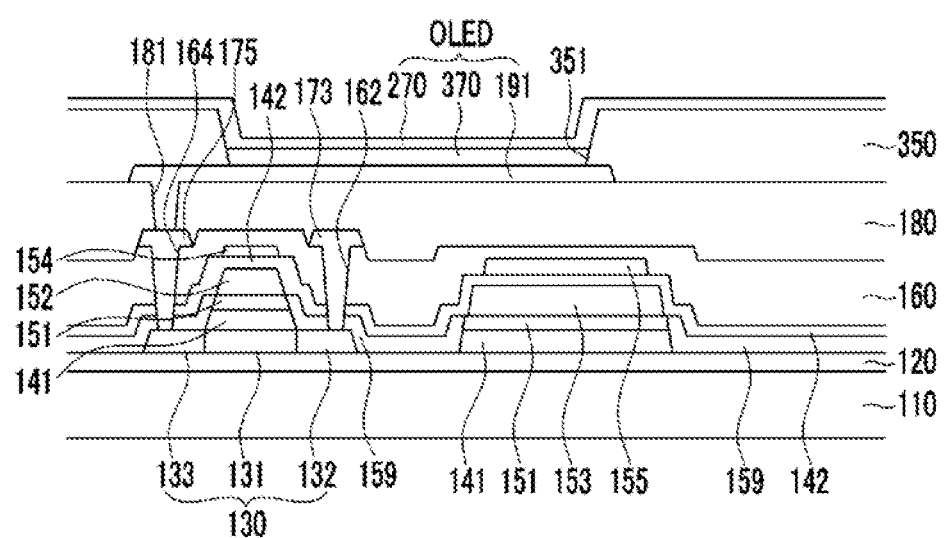
FIG. 1 is a cross-sectional view illustrating an organic light emitting diode display according to an exemplary embodiment of the present invention.

Exemplary embodiments of the present invention will be described in more detail below with reference to the accompanying drawings, in which exemplary embodiments of the present invention are shown. As those skilled in the art would realize, the described embodiments may be modified in various different ways, all without departing from the spirit or scope of the present invention.

In the drawings, the thicknesses of layers, films, panels, or regions may be exaggerated for clarity. Like reference numerals may refer to like elements throughout the specification and drawings. It will be understood that when an element such as a layer, film, region, or substrate is referred to as being "on" another element, it may be directly on the other element or intervening elements may be present.

An organic light emitting diode display according to an exemplary embodiment of the present invention will be described in more detail below with reference to FIG. 1.

FIG. 1 is a cross-sectional view illustrating an organic light emitting diode display according to an exemplary embodiment of the present invention.

Referring to FIG. 1, the organic light emitting diode display according to an exemplary embodiment of the present invention may include a substrate 110, a semiconductor 130 disposed on the substrate 110, a first gate insulation layer 141 disposed on the semiconductor 130, a first diffusion barrier layer 151 disposed on the first gate insulation layer 141, a second diffusion barrier layer 159 in contact with a lateral surface of the first diffusion barrier layer 151, and a first gate electrode 152 disposed on the first diffusion barrier layer 151.

The substrate 110 may include an insulating substrate. The insulating substrate may include glass, quartz, ceramic, or plastic. However, exemplary embodiments of the present invention are not limited thereto, and the substrate 110 may include a metal substrate. The metal substrate may include stainless steel.

A buffer layer 120 may be disposed on the substrate 110. The buffer layer 120 may include a silicon nitride ($SiN_x$) or a silicon oxide ($SiO_x$). The buffer layer 120 may reduce or prevent impurities or moisture from infiltrating the substrate 110 (e.g., while planarizing a surface of the substrate 110). According to an exemplary embodiment of the present invention, the buffer layer 120 may be omitted.

The semiconductor 130 may be disposed on the buffer layer 120. The semiconductor 130 may include an oxide semiconductor material. The semiconductor 130 may include a channel region 131 to which an impurity is not doped, and contact doping regions 132 and 133 disposed on opposite sides of the channel region 131 and to which an impurity is doped. The contact doping regions 132 and 133 may include a source region 132 and a drain region 133. The impurity may be selected depending on a type of a thin film transistor.

The first gate insulation layer 141 may include silicon nitride ($SiN_x$) or silicon oxide ($SiO_x$). The first gate insulation layer 141 may overlap the channel region 131 of the semiconductor 130. The first gate insulation layer 141 need not overlap the source region 132 and the drain region 133 of the semiconductor 130.

The first diffusion barrier layer 151 may include a metal. For example, the first diffusion barrier layer 151 may include titanium (Ti). The first diffusion barrier layer 151 may overlap the channel region 131 of the semiconductor 130. The first diffusion barrier layer 151 need not overlap the source region 132 and the drain region 133 of the semiconductor 130.

The second diffusion barrier layer 159 may include a metal oxide including the same metal as the first diffusion barrier layer 151. For example, the second diffusion barrier layer 159 may include titanium oxide ($TiO_x$). The second diffusion barrier layer 159 may overlap the source region 132 and the drain region 133 of the semiconductor 130. The second diffusion barrier layer 159 may be disposed directly on the source region 132 and the drain region 133 of the semiconductor 130. The second diffusion barrier layer 159 may cover upper surfaces and lateral surfaces of the source region 132 and the drain region 133 of the semiconductor 130. The second diffusion barrier layer 159 may be substantially entirely overlapped with the source region 132 and the drain region 133 of the semiconductor 130. The second diffusion barrier layer 159 may contact a lateral surface of the first gate insulation layer 141 and may be disposed on the buffer layer 120.

The first gate electrode 152 may include copper (Cu). The first gate electrode 152 may overlap the channel region 131 of the semiconductor 130. Planar shapes of the first gate electrode 152 and the first diffusion barrier layer 151 may be substantially identical to each other. The first gate electrode 152 and the first diffusion barrier layer 151 may have a substantially identical planar shape at a contacting surface between the first gate electrode 152 and the first diffusion barrier layer 151. Lateral surfaces of the first gate electrode 152 and the first diffusion barrier layer 151 may have a tapered shape, and thus, planar shapes of the first gate electrode 152 and the first diffusion barrier layer 151 may be substantially identical to each other. However, according to an exemplary embodiment of the present invention planar sizes of the first gate electrode 152 and the first diffusion barrier layer 151 may be slightly different from each other. Thus, lateral edges of the first gate electrode 152 and the first diffusion barrier layer 151 may be substantially aligned with each other.

A second gate insulation layer 142 may be disposed on the first gate electrode 152 and the second diffusion barrier layer 159. The second gate insulation layer 142 may include silicon nitride ($SiN_x$).

In an exemplary embodiment of the present invention, the first gate electrode 152 may include copper (Cu). The second gate insulation layer 142 may be formed after the first gate electrode 152 is formed. Since the second gate insulation layer 142 may include silicon nitride ($SiN_x$), oxidation of copper may be reduced or prevented during a process of forming the second gate insulation layer 142. Since the first diffusion barrier layer 151 may be disposed under the first gate electrode 152, a diffusion of hydrogen into the semiconductor 130 during the process of forming the second gate insulation layer 142 may be reduced or prevented. The semiconductor 130 may be an oxide semiconductor. The second diffusion barrier layer 159 contacting the first diffusion barrier layer 151 may include a metal oxide instead of a metallic material, and edges of the first diffusion barrier layer 151 and the first gate electrode 152 may substantially coincide with each other. Thus, a relatively high current may be prevented from flowing at an edge of the first diffusion barrier layer 151. Thus, performance of the thin film transistor may be prevented from deteriorating.

A second gate electrode 154 may be disposed on the second gate insulation layer 142. The second gate electrode 154 may overlap the first gate electrode 152.

An interlayer insulation layer 160 may be disposed on the second gate electrode 154 and the second gate insulation layer 142.

Contact holes 162 and 164 exposing at least a part of the semiconductor 130 may be formed in the second diffusion barrier layer 159, the second gate insulation layer 142, and the interlayer insulation layer 160. The contact holes 162 and 164 may expose the contact doping regions 132 and 133 of the semiconductor 130.

A source electrode 173 and a drain electrode 175 may be disposed on the interlayer insulation layer 160. The source electrode 173 may be connected to the source region 132 of the semiconductor 130 through the contact hole 162, and the drain electrode 175 may be connected to the drain region 133 of the semiconductor 130 through the contact hole 164.

Thus, the semiconductor 130, the first gate electrode 152, the source electrode 173, and the drain electrode 175 may be included in one thin film transistor. The thin film transistor may be a switching transistor or a driving transistor. The substrate 110 in which the thin film transistor is formed may be referred to as a thin film transistor array panel.

A passivation layer 180 may be disposed on the interlayer insulation layer 160, the source electrode 173, and the drain electrode 175. A contact hole 181 may be formed in the passivation layer 180 to expose at least a part of the drain electrode.

A pixel electrode 191 may be disposed on the passivation layer 180. The pixel electrode 191 may include a transparent conductive material such as indium-tin oxide (ITO), indium-zinc oxide (IZO), zinc oxide (ZnO), or indium oxide ($In_2O_3$), or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 191 may be electrically connected to the drain electrode 175 through the contact hole 181 to serve as an anode of an organic light emitting diode (OLED).

A pixel definition layer 350 may be disposed on the passivation layer 180 and an edge portion of the pixel electrode 191. The pixel definition layer 350 may include a pixel opening 351 exposing the pixel electrode 191. The pixel definition layer 350 may include a resin such as a polyacrylate, or a polyimide, or a silica-based inorganic material.

An organic emission layer 370 may be formed in the pixel opening 351 of the pixel definition layer 350. The organic emission layer 370 may include at least one of an emission layer, a hole-injection layer (HIL), a hole-transport layer (HTL), an electron-transport layer (ETL), and an electron-injection layer (EIL).

The organic emission layer 370 may include a red organic emission layer emitting red light, a green organic emission layer emitting green light, and a blue organic emission layer emitting blue light. According to an exemplary embodiment of the present invention, the red organic emission layer, the green organic emission layer, and the blue organic emission layer may be respectively formed in a red pixel, a green pixel, and a blue pixel to display a color image.

According to an exemplary embodiment of the present invention, the organic emission layer 370 may display a color image by stacking a red organic emission layer, a green organic emission layer, and a blue organic emission layer in each of a red pixel, a green pixel, and a blue pixel to form a red filter, a green filter, and a blue filter for each pixel. According to an exemplary embodiment of the present invention, a color image may be displayed by forming a white organic emission layer emitting white light in each of the red pixel, the green pixel, and the blue pixel to form a red filter, a green filter, and a blue filter for each pixel. When a color image is displayed by using the white organic emission layer and the color filters, a deposition mask for depositing a red organic emission layer, a green organic emission layer, and a blue organic emission layer on each of the pixels (e.g., the red pixel, the green pixel, and the blue pixel) may be omitted.

The white organic emission layer may include one organic emission layer, or may include a plurality of organic emission layers to emit white light. Alternatively, the white organic emission layer may include at least one yellow organic emission layer and at least one blue organic emission layer to emit white light, by combining at least one cyan organic emission layer and at least one red organic emission layer to emit white light, by combining at least one magenta organic emission layer and at least one green organic emission layer to emit white light, and the like.

A common electrode 270 may be disposed on the pixel definition layer 350 and the organic emission layer 370. The common electrode 270 may include a transparent conductive material such as indium-tin oxide (ITO), indium-zinc oxide (IZO), zinc oxide (ZnO), indium oxide ($In_2O_3$), or the like, or a reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 270 may serve as a cathode of an organic light emitting diode (OLED). The pixel electrode 191, the organic emission layer 370, and the common electrode 270 may be included in the organic light emitting diode (OLED).

An organic light emitting diode display according to an exemplary embodiment of the present invention may include a first storage electrode 153 disposed on the substrate 110 and a second storage electrode 155 overlapping the first storage electrode 153.

The first diffusion barrier layer 151, the first gate insulation layer 141, and the buffer layer 120 may be disposed under the first storage electrode 153. The second gate insulation layer 142 may be disposed between the first storage electrode 153 and the second storage electrode 155. The first storage electrode 153 and the second storage electrode 155 may be included in a storage capacitor together with the second gate insulation layer 142 as a dielectric material.

A manufacturing method of an organic light emitting diode display according to an exemplary embodiment of the present invention will be described in more detail below with reference to FIG. 2 to FIG. 6.

FIG. 2 to FIG. 6 are process cross-sectional views illustrating a manufacturing method of an organic light emitting diode display according to an exemplary embodiment of the present invention.

Figure 2:
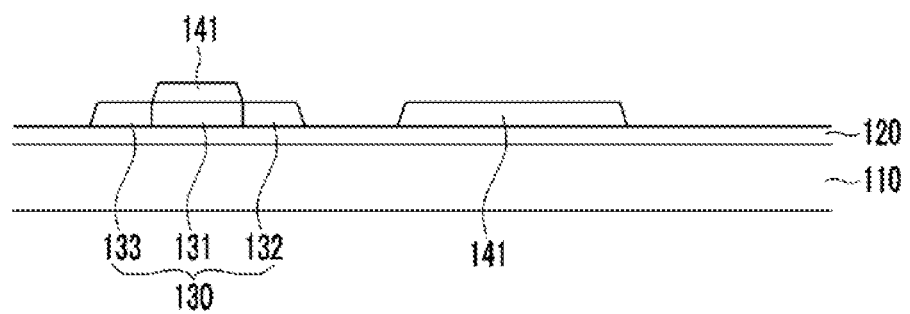
FIG. 2 to FIG. 6 are process cross-sectional views illustrating a manufacturing method of an organic light emitting diode display according to an exemplary embodiment of the present invention.

Referring to FIG. 2, the buffer layer 120 may be formed by depositing silicon nitride ($SiN_x$) or silicon oxide ($SiO_x$) on the substrate 110.

The semiconductor 130 may be formed by depositing an oxide semiconductor material on the buffer layer 120 and then patterning it.

The first gate insulation layer 141 may be formed by depositing silicon nitride ($SiN_x$) or silicon oxide ($SiO_x$) on the semiconductor 130 and the buffer layer 120 and then patterning it.

The semiconductor 130 may include the channel region 131, and the source region 132 and the drain region 133 disposed on opposite sides of the channel region 131. The first gate insulation layer 141 may overlap the channel region 131 of the semiconductor 130.

Figure 3:
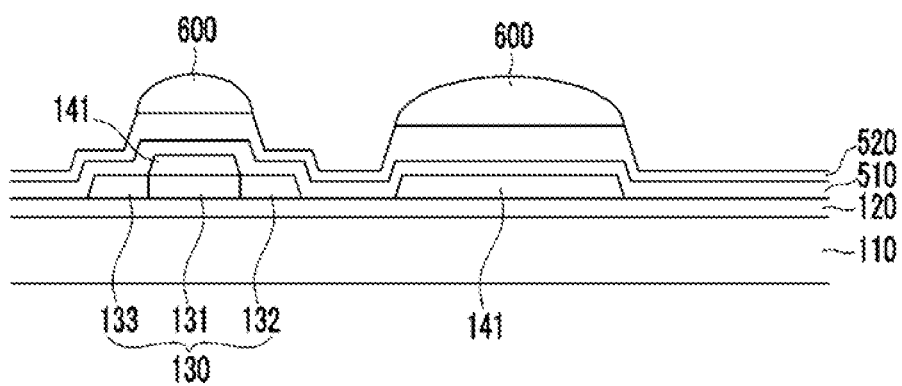

Referring to FIG. 3, a first metallic material layer 510 and a second metallic material layer 520 may be sequentially deposited on the first gate insulation layer 141, the semiconductor 130, and the buffer layer 120. The first metallic material layer 510 may include titanium (Ti), and the second metallic material layer 520 may include copper (Cu).

A photoresist pattern 600 may be formed by coating a photosensitive material on the second metallic material layer 520 and then patterning it.

Figure 4:
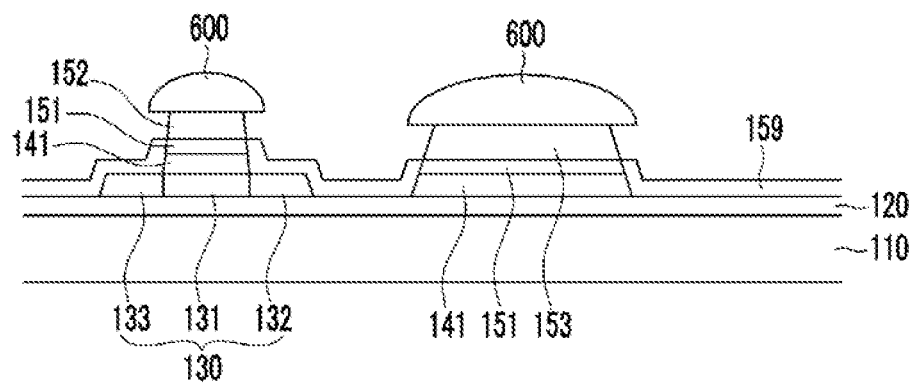

Referring to FIG. 4, the first gate electrode 152 and the first storage electrode 153 may be formed by etching the second metallic material layer 520 using the photoresist pattern 600 as a mask.

The second diffusion barrier layer 159 may be formed by oxidizing the first metallic material layer 510 using the photoresist pattern 600 as a mask. A part of the first metallic material layer 510, which is disposed under the photoresist pattern 600, and thus might not be oxidized, may serve as the first diffusion barrier layer 151.

Thus, the first diffusion barrier layer 151 may include titanium (Ti), and the second diffusion barrier layer 159 may include titanium oxide ($TiO_x$).

In an exemplary embodiment of the present invention, the photoresist pattern 600 may be employed as a mask to etch the second metallic material layer 520 and to oxidize the first metallic material layer 510. Thus, planar shapes of the first gate electrode 152 and the first diffusion barrier layer 151 may be substantially identical to each other. Edges of the first gate electrode 152 and the first diffusion barrier layer 151 may substantially coincide with each other, and the first diffusion barrier layer 151 need not protrude more than the first gate electrode 152. Thus, a relatively high current may be reduced or prevented from being generated at an edge of the first diffusion barrier layer 151, and performance of the thin film transistor may be prevented from deteriorating.

Figure 5:
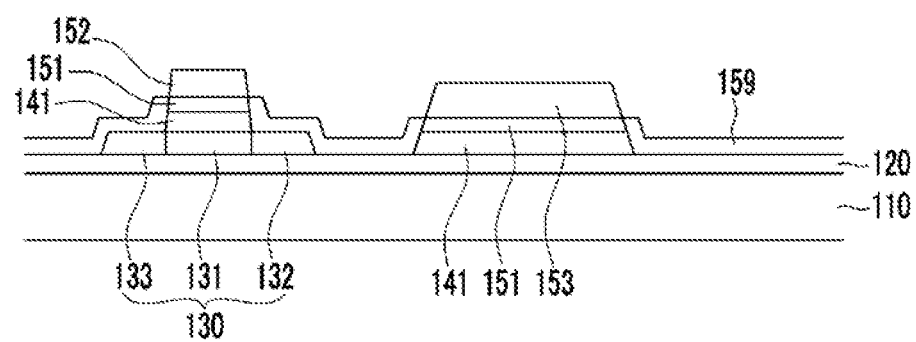

Referring to FIG. 5, the photoresist pattern 600 may be removed.

Figure 6:
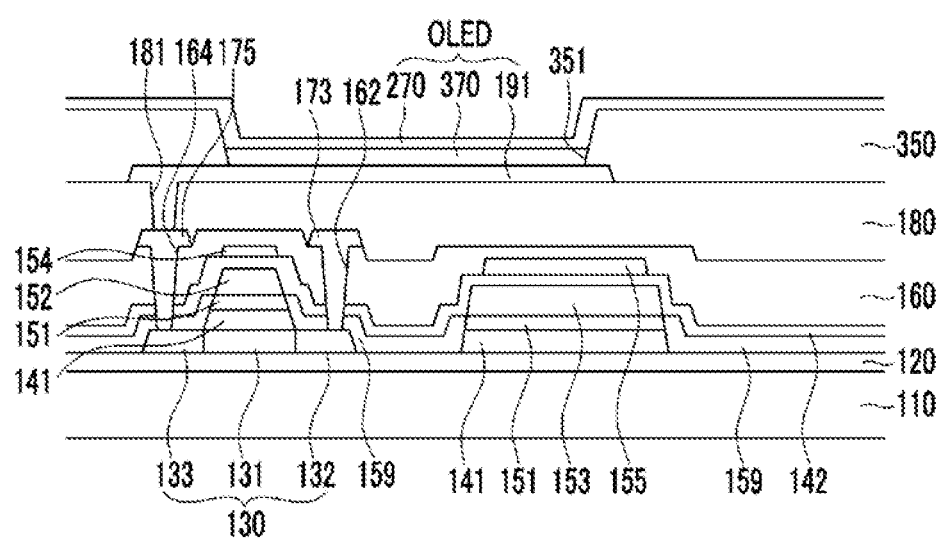

Referring to FIG. 6, the second gate insulation layer 142 may be formed by depositing silicon nitride ($SiN_x$) on the first gate electrode 152 and the second diffusion barrier layer 159.

The second gate electrode 154 overlapping the first gate electrode 152 and the second storage electrode 155 formed overlapping the first storage electrode 153 may be formed by depositing a metal material on the second gate insulation layer 142 and then patterning it.

The interlayer insulation layer 160 may be disposed on the second storage electrode 155 and the second gate insulation layer 142. The contact holes 162 and 164 exposing the source region 132 and the drain region 133 of the semiconductor 130 may be formed by patterning the interlayer insulation layer 160.

The source electrode 173 and the drain electrode 175 may be formed by depositing a metal material on the interlayer insulation layer 160 and then patterning it. The source electrode 173 and the drain electrode 175 may be respectively connected to the source region 132 and the drain region 133 of the semiconductor 130 through the contact holes 162 and 164.

The passivation layer 180 may be disposed on the source electrode 173, the drain electrode 175, and the interlayer insulation layer 160. The contact hole 181 exposing the drain electrode 175 may be formed by patterning the passivation layer 180.

The pixel electrode 191 may be formed by depositing a metal material on the passivation layer 180 and then patterning it. The pixel electrode 191 may be connected to the drain electrode 175 through the contact hole 181.

The pixel definition layer 350 may be formed by depositing an insulating material on the pixel electrode 191 and the passivation layer 180 and then patterning it. The pixel definition layer 350 may include the pixel opening 351 formed to expose the pixel electrode 191.

The organic emission layer 370 may be formed in the pixel opening 351. The common electrode 270 may be formed by depositing a metal material on the organic emission layer 370 and the pixel definition layer 350 and then patterning it.

An organic light emitting diode display according to an exemplary embodiment of the present invention will be described in more detail below with reference to FIG. 7.

Since the organic light emitting diode display according to an exemplary embodiment of the present invention described with reference to FIG. 7 may include substantially identical elements to those of the organic light emitting diode display according to an exemplary embodiment of the present invention described with reference to FIG. 1, duplicative descriptions may be omitted. Referring to FIG. 7, a first gate insulation layer may cover a source region and a drain region as well as a channel region of a semiconductor. The semiconductor will be described in more detail below with reference to FIG. 7.

Figure 7:
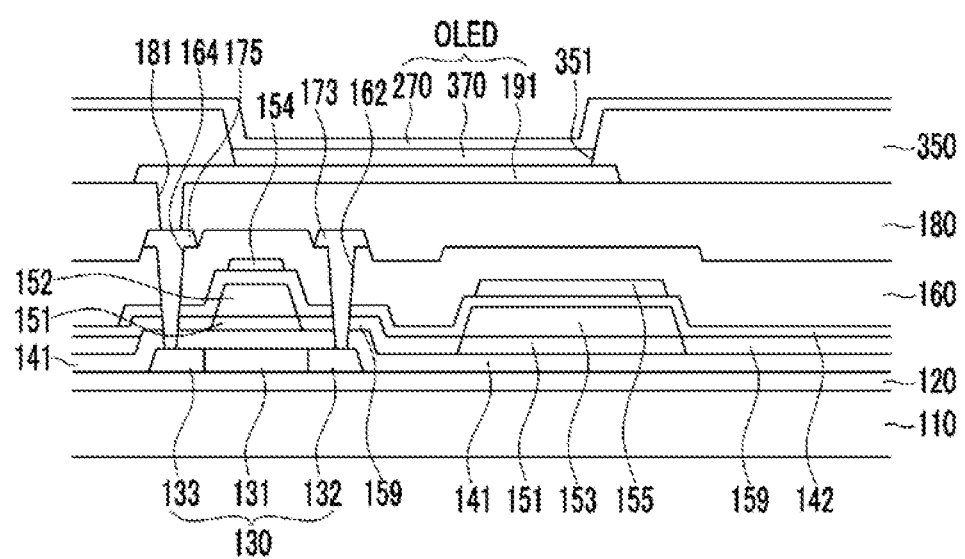
FIG. 7 is a cross-sectional view illustrating an organic light emitting diode display according to an exemplary embodiment of the present invention.

FIG. 7 is a cross-sectional view illustrating the organic light emitting diode display according to an exemplary embodiment of the present invention.

Referring to FIG. 7, the organic light emitting diode display according to an exemplary embodiment of the present invention may include the substrate 110, the semiconductor 130 disposed on the substrate 110, the first gate insulation layer 141 disposed on the semiconductor 130, the first diffusion barrier layer 151 disposed on the first gate insulation layer 141, the second diffusion barrier layer 159 in contact with a lateral surface of the first diffusion barrier layer 151, and the first gate electrode 152 disposed on the first diffusion barrier layer 151.

According to an exemplary embodiment of the present invention, the first gate insulation layer 141 may overlap the channel region 131 of the semiconductor 130, and might not overlap the source region 132 and the drain region 133. However, according to another exemplary embodiment of the present invention, the first gate insulation layer 141 may overlap the channel region 131, the source region 132, and the drain region 133 of the semiconductor 130. The first gate insulation layer 141 may be disposed directly on the channel region 131, the source region 132, and the drain region 133 of the semiconductor 130. The first gate insulation layer 141 may cover both of an upper surface and a lateral surface of the semiconductor 130.

According to an exemplary embodiment of the present invention, the second diffusion barrier layer 159 may be disposed directly on the source region 132 and the drain region 133 of the semiconductor 130. However, according to another exemplary embodiment of the present invention, the first gate insulation layer 141 may be disposed between the second diffusion barrier layer 159 and the source region 132 of the semiconductor 130 and between the second diffusion barrier layer 159 and the drain region 133 of the semiconductor 130. Thus, the second diffusion barrier layer 159 may be disposed directly on the first gate insulation layer 141.

A manufacturing method of an organic light emitting diode display according to an exemplary embodiment of the present invention will be described in more detail below with reference to FIG. 8 to FIG. 11.

Since the organic light emitting diode display according to an exemplary embodiment of the present invention described with reference to FIG. 8 to FIG. 11 may include substantially identical elements to those of the organic light emitting diode display according to an exemplary embodiment of the present invention described with reference to FIG. 2 to FIG. 6, duplicative descriptions may be omitted.

FIG. 8 to FIG. 11 are process cross-sectional views illustrating a manufacturing method of an organic light emitting diode display according to an exemplary embodiment of the present invention.

Figure 8:
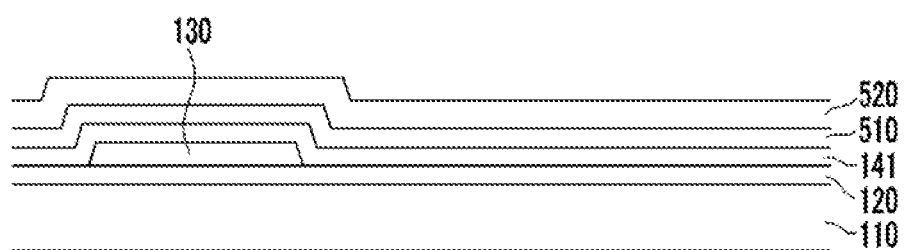
FIG. 8 to FIG. 11 are process cross-sectional views illustrating a manufacturing method of an organic light emitting diode display according to an exemplary embodiment of the present invention.

Referring to FIG. 8, the buffer layer 120 may be disposed on the substrate 110, and the semiconductor 130 may be disposed on the buffer layer 120.

The first gate insulation layer 141, the first metallic material layer 510, and the second metallic material layer 520 may be sequentially deposited on the semiconductor 130 and the buffer layer 120.

Figure 9:
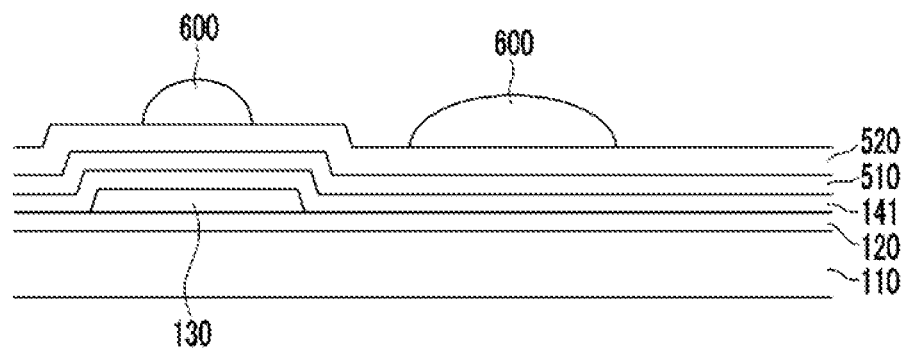

Referring to FIG. 9, the photoresist pattern 600 may be formed by coating a photosensitive material on the second metallic material layer 520 and then patterning it.

Figure 10:
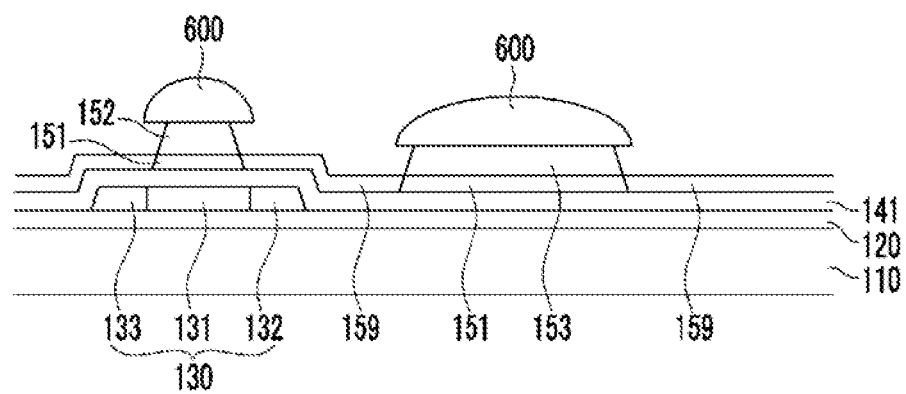

Referring to FIG. 10, the first gate electrode 152 and the first storage electrode 153 may be formed by etching the second metallic material layer 520 using the photoresist pattern 600 as a mask.

The second diffusion barrier layer 159 may be formed by oxidizing the first metallic material layer 510 using the photoresist pattern 600 as a mask. A part of the first metallic material layer 510, which is disposed under the first gate electrode 152 and the first storage electrode 153 and thus might not be oxidized, may serve as the first diffusion barrier layer 151.

The first diffusion barrier layer 151 may include titanium (Ti), and the second diffusion barrier layer 159 may include titanium oxide ($TiO_x$).

Figure 11:
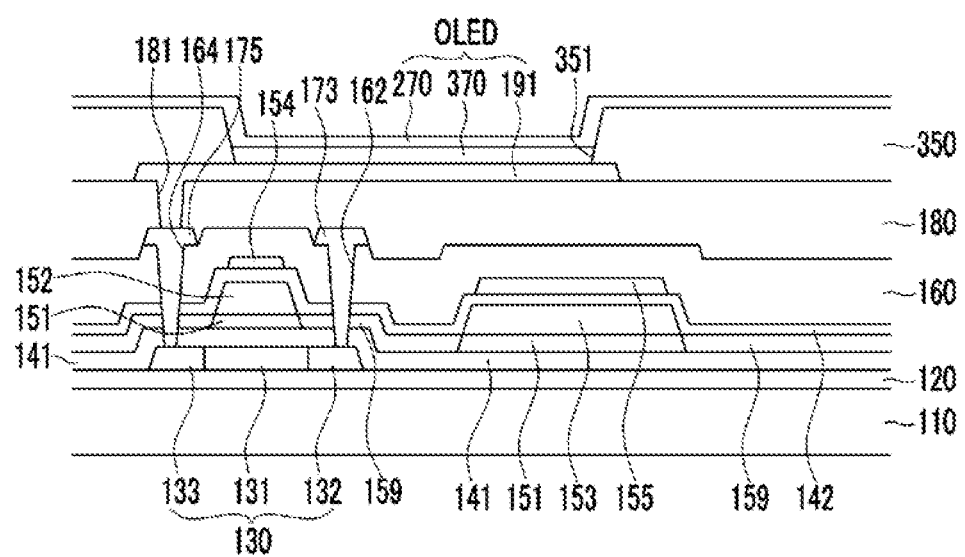

The photoresist pattern 600 may then be removed, and the second gate insulation layer 142, the second gate electrode 154, the interlayer insulation layer 160, the source electrode 173, the drain electrode 175, the passivation layer 180, the pixel electrode 191, the pixel definition layer 350, the organic emission layer 370, and the common electrode 270 may be sequentially formed (see, e.g., FIG. 11).

An organic light emitting diode display according to an exemplary embodiment of the present invention will be described in more detail below with reference to FIG. 12.

Since the organic light emitting diode display according to an exemplary embodiment of the present invention described with reference to FIG. 12 may include substantially identical elements to those of the organic light emitting diode display according to an exemplary embodiment of the present invention described with reference to FIG. 1, duplicative descriptions may be omitted. A source region and a drain region of a semiconductor may be partially rather than entirely overlapped with a second diffusion barrier layer. The semiconductor will be described below in more detail.

Figure 12:
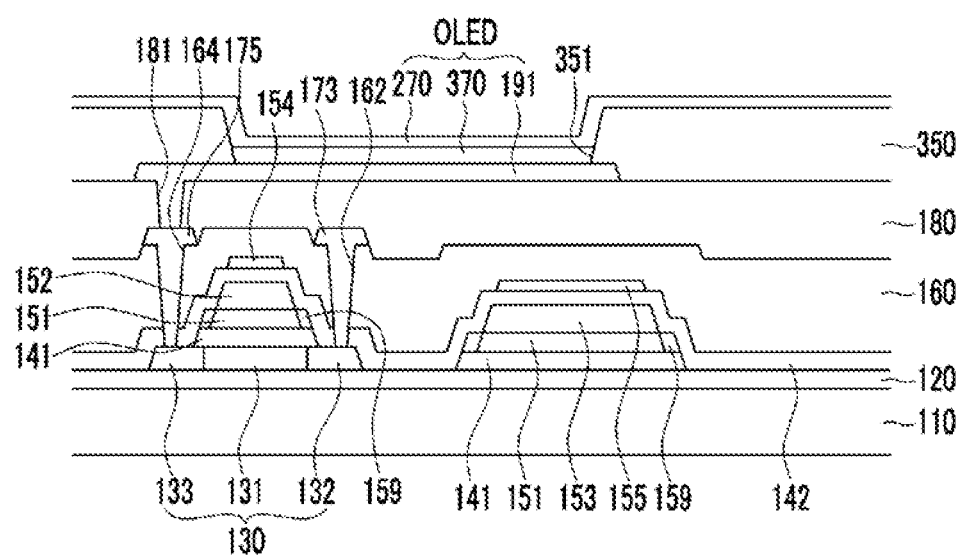
FIG. 12 is a cross-sectional view illustrating an organic light emitting diode display according to an exemplary embodiment of the present invention.

FIG. 12 is a cross-sectional view illustrating an organic light emitting diode display according to an exemplary embodiment of the present invention.

Referring to FIG. 12, the organic light emitting diode display according to an exemplary embodiment of the present invention may include the substrate 110, the semiconductor 130 disposed on the substrate 110, the first gate insulation layer 141 disposed on the semiconductor 130, the first diffusion barrier layer 151 disposed on the first gate insulation layer 141, the second diffusion barrier layer 159 contacting a lateral surface of the first diffusion barrier layer 151, and the first gate electrode 152 disposed on the first diffusion barrier layer 151.

According to an exemplary embodiment of the present invention, the second diffusion barrier layer 159 may cover upper surfaces and lateral surfaces of the source region 132 and the drain region 133 of the semiconductor 130, and may be substantially entirely overlapped with the source region 132 and the drain region 133 of the semiconductor 130. According to another exemplary embodiment of the present invention, the second diffusion barrier layer 159 may be partially overlapped with the source region 132 and the drain region 133 of the semiconductor 130. Most of the source region 132 and the drain region 133 of the semiconductor 130 might not be covered with the second diffusion barrier layer 159.

The second gate insulation layer 142 may be disposed on the first gate electrode 152, the second diffusion barrier layer 159, and the semiconductor 130. The second gate insulation layer 142 may be disposed directly on the source region 132 and the drain region 133 of the semiconductor 130.

A manufacturing method of an organic light emitting diode display according to an exemplary embodiment of the present invention will be described in more detail below with reference to FIG. 13 to FIG. 17.

Since the organic light emitting diode display according to an exemplary embodiment of the present invention described with reference to FIG. 13 to FIG. 17 may include substantially identical elements to those of the organic light emitting diode display according to an exemplary embodiment of the present invention described with reference to FIG. 2 to FIG. 6, duplicative descriptions may be omitted.

FIG. 13 to FIG. 17 are process cross-sectional views illustrating a manufacturing method of an organic light emitting diode display according to an exemplary embodiment of the present invention.

Figure 13:
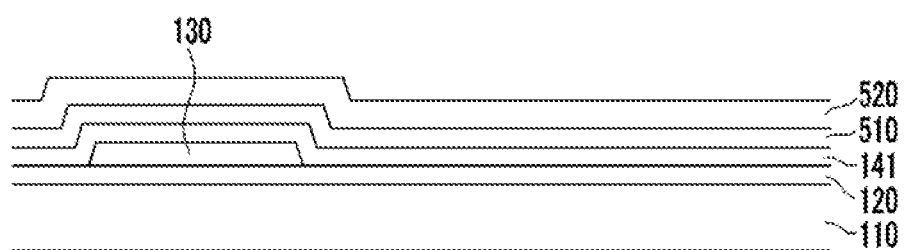
FIG. 13 to FIG. 17 are process cross-sectional views illustrating a manufacturing method of an organic light emitting diode display according to an exemplary embodiment of the present invention.

Referring to FIG. 13, the buffer layer 120 may be disposed on the substrate 110, and the semiconductor 130 may be disposed on the buffer layer 120.

The first gate insulation layer 141, the first metallic material layer 510, and the second metallic material layer 520 may be sequentially deposited on the semiconductor 130 and the buffer layer 120.

Figure 14:
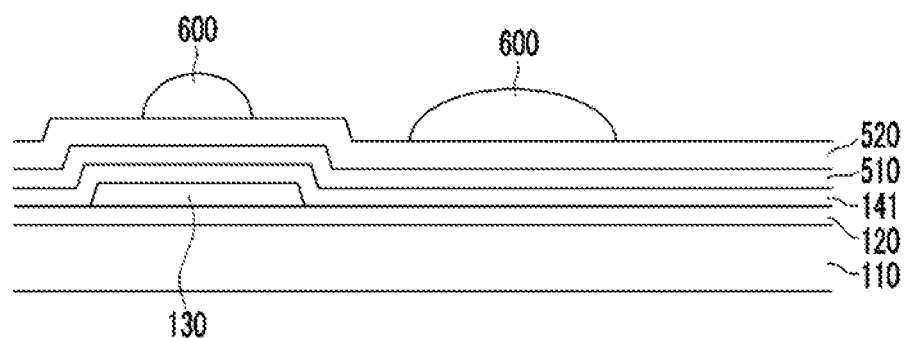

Referring to FIG. 14, the photoresist pattern 600 may be formed by coating a photosensitive material on the second metallic material layer 520 and then patterning it.

Figure 15:
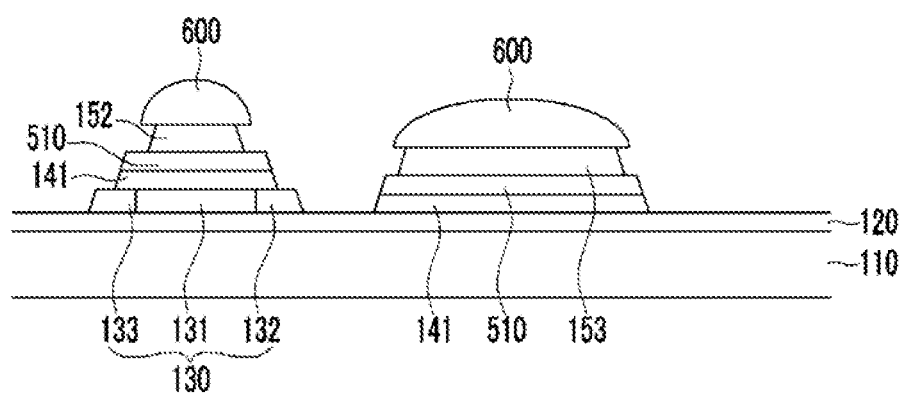

Referring to FIG. 15, the first gate electrode 152 and the first storage electrode 153 may be formed by jointly etching the second metallic material layer 520 and the first metallic material layer 510 using the photoresist pattern 600 as a mask. The second metallic material layer 520 and the first metallic material layer 510 may be jointly etched by a wet etching method. A part of the first metallic material layer 510 may be protruded more than the first gate electrode 152 because of a difference between an etching rate of the first metallic material layer 510 and an etching rate of the second metallic material layer 520.

The first gate insulation layer 141 is etched by using the photoresist pattern 600 as a mask. The first gate insulation layer 141 may be etched by a dry etching method.

Figure 16:
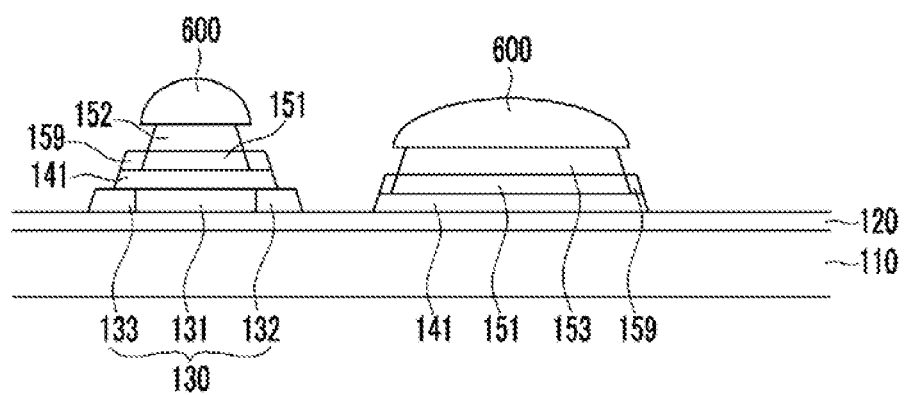

Referring to FIG. 16, the second diffusion barrier layer 159 may be formed by oxidizing the first metallic material layer 510 using the photoresist pattern 600 as a mask. A part of the first metallic material layer 510 which is disposed under the first gate electrode 152 and the first storage electrode 153 and thus might not be oxidized may serve as the first diffusion barrier layer 151.

The first diffusion barrier layer 151 may include titanium (Ti), and the second diffusion barrier layer 159 may include titanium oxide ($TiO_x$).

Figure 17:
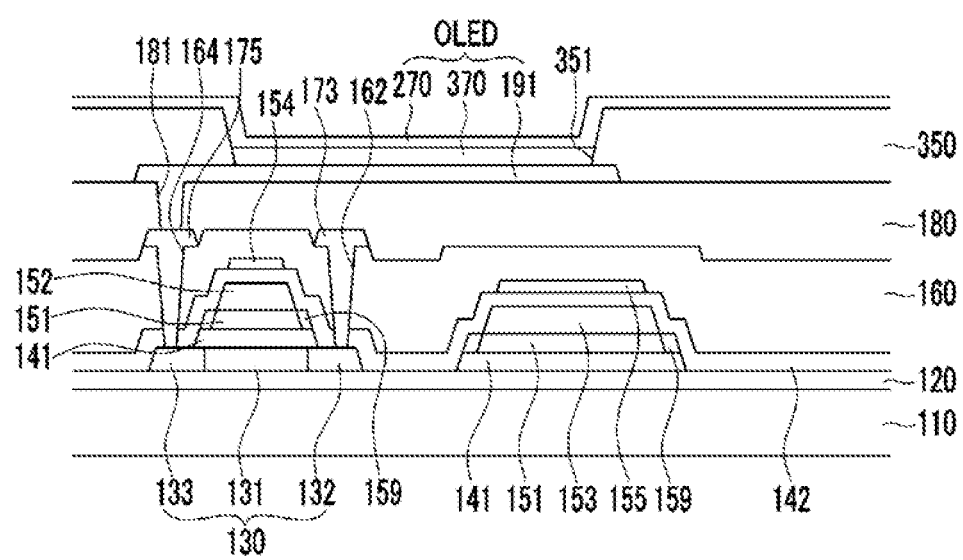

The photoresist pattern 600 may be removed, and the second gate insulation layer 142, the second gate electrode 154, the interlayer insulation layer 160, the source electrode 173, the drain electrode 175, the passivation layer 180, the pixel electrode 191, the pixel definition layer 350, the organic emission layer 370, and the common electrode 270 may be sequentially formed (see, e.g., FIG. 17).

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A thin film transistor array panel comprising:
a substrate;
an oxide semiconductor disposed on the substrate;
a first gate insulation layer disposed on the oxide semiconductor;
a first layer disposed on the first gate insulation layer;
a second layer disposed on the oxide semiconductor;
a first gate electrode disposed on the first layer; and
a source electrode and a drain electrode connected to the oxide semiconductor,
wherein the first layer comprises a metal and the second layer comprises a metal oxide including the metal, and
wherein the oxide semiconductor is between the substrate and the first gate insulation layer.

2. The thin film transistor array panel of claim 1, wherein a lateral edge of the second layer contacts a lateral edge of the first layer.

3. The thin film transistor array panel of claim 1, wherein lateral edges of the first layer and the first gate electrode layer are substantially aligned with each other.

4. The thin film transistor array panel of claim 1, wherein lateral edges of the second layer and the first gate insulation layer are substantially aligned with each other.

5. The thin film transistor array panel of claim 1, wherein the first gate electrode includes copper, the first layer includes titanium, and the second layer includes titanium oxide.

6. The thin film transistor array panel of claim 1, wherein the oxide semiconductor includes a channel region, and a source region and a drain region disposed on opposite sides of the channel region.

7. The thin film transistor array panel of claim 6, wherein the first gate insulation layer, the first layer, and the first gate electrode overlap the channel region of the oxide semiconductor.

8. The thin film transistor array panel of claim 6, wherein the second layer is partially overlapped with the source region and the drain region of the oxide semiconductor.

9. The thin film transistor array panel of claim 6, further comprising:
a second gate insulation layer disposed on the first gate electrode, the second layer, and the oxide semiconductor.

10. The thin film transistor array panel of claim 9, wherein the second gate insulation layer is disposed directly on the source region and the drain region of the oxide semiconductor.

11. The thin film transistor array panel of claim 9, wherein the second gate insulation layer is disposed directly on a surface of the second layer.

12. The thin film transistor array panel of claim 9, further comprising:
a second gate electrode disposed on the second gate insulation layer; and
an interlayer insulation layer disposed on the second gate electrode and the second gate insulation layer,
wherein the source electrode and the drain electrode are disposed on the interlayer insulation layer.

13. A thin film transistor array panel comprising:
a substrate;
an oxide semiconductor disposed on the substrate;
a first gate insulation layer disposed on the oxide semiconductor;
a first layer disposed on the first gate insulation layer and including titanium;

a second layer disposed on the oxide semiconductor and including titanium oxide;

a first gate electrode disposed on the first layer; and a source electrode and a drain electrode connected to the oxide semiconductor, wherein the oxide semiconductor is between the substrate and the first gate insulation layer.

14. The thin film transistor array panel of claim 13, further comprising:

a second gate insulation layer disposed on the first gate electrode, the second layer, and the oxide semiconductor.

15. The thin film transistor array panel of claim 13, wherein a lateral edge of the second layer contacts a lateral edge of the first layer.

16. The thin film transistor array panel of claim 15, wherein the second layer disposed on a surface of the first gate insulation layer, and lateral edges of the second layer and the first gate insulation layer are substantially aligned with each other.

17. The thin film transistor array panel of claim 14, wherein the second gate insulation layer is disposed directly on a surface of the second layer.

18. An organic light emitting diode display comprising:

a substrate;

an oxide semiconductor disposed on the substrate;

a first gate insulation layer disposed on the oxide semiconductor;

a first layer disposed on the first gate insulation layer and including titanium;

a second layer disposed on the oxide semiconductor and including titanium oxide;

a first gate electrode disposed on the first layer;

a source electrode and a drain electrode connected to the oxide semiconductor;

a first electrode connected to the drain electrode;

an organic emission layer disposed on the first electrode; and a second electrode disposed on the organic emission layer.

19. The organic light emitting diode display of claim 18, wherein a lateral edge of the second layer contacts a lateral edge of the first layer.

20. The organic light emitting diode display of claim 18, wherein the second layer disposed on a surface of the first gate insulation layer, and lateral edges of the second layer and the first gate insulation layer are substantially aligned with each other.

* * * * *